US008022306B2

(12) United States Patent
Ebe et al.

(10) Patent No.: US 8,022,306 B2
(45) Date of Patent: Sep. 20, 2011

(54) PRINTED CIRCUIT BOARD AND METHOD OF MANUFACTURING THE SAME

(75) Inventors: Hirofumi Ebe, Ibaraki (JP); Yasuto Ishimaru, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 341 days.

(21) Appl. No.: 12/426,404

(22) Filed: Apr. 20, 2009

(65) Prior Publication Data

US 2009/0277667 A1  Nov. 12, 2009

(30) Foreign Application Priority Data

May 9, 2008  (JP) .................................. 2008-123810

(51) Int. Cl.
*H05K 1/09* (2006.01)
*B05D 5/12* (2006.01)

(52) U.S. Cl. ........ 174/252; 174/255; 361/719; 361/720; 361/723

(58) Field of Classification Search .................. 174/252; 361/723
See application file for complete search history.

(56) References Cited

U.S. PATENT DOCUMENTS

| | | | | |
|---|---|---|---|---|
| 5,874,776 A * | 2/1999 | Kresge et al. | ................... | 257/747 |
| 6,134,776 A * | 10/2000 | Hoffmeyer | ...................... | 29/840 |
| 6,563,712 B2 * | 5/2003 | Akram et al. | ................... | 361/719 |
| 6,830,813 B2 * | 12/2004 | Ravi | ............................. | 428/408 |
| 7,420,270 B2 * | 9/2008 | Lee et al. | ....................... | 257/691 |
| 7,911,050 B2 * | 3/2011 | Nakajima | ...................... | 257/712 |
| 7,915,727 B2 * | 3/2011 | Choi et al. | ..................... | 257/702 |
| 2006/0071325 A1 | 4/2006 | Tanaka | | |
| 2006/0274252 A1 | 12/2006 | Son | | |
| 2007/0013056 A1 | 1/2007 | Lee et al. | | |
| 2008/0023822 A1 | 1/2008 | Lee et al. | | |
| 2009/0044967 A1 | 2/2009 | Nakahama et al. | | |
| 2009/0195997 A1 | 8/2009 | Ishimaru et al. | | |

FOREIGN PATENT DOCUMENTS

| | | |
|---|---|---|
| EP | 2007180 A1 | 12/2008 |
| JP | 2006-108356 A | 4/2006 |
| JP | 2007-027682 A | 2/2007 |
| KR | 100771890 B1 | 11/2007 |
| WO | 2007105763 A1 | 9/2007 |

* cited by examiner

*Primary Examiner* — Judy Nguyen
*Assistant Examiner* — Hiram E Gonzalez
(74) *Attorney, Agent, or Firm* — Panitch Schwarze Belisario & Nadel LLP

(57) ABSTRACT

A mounting region is provided at a substantially center of one surface of an insulating layer. A metal layer is provided on the other surface of the insulating layer. A slit is formed to cross a region (an opposite region) of the metal layer that coincides with the mounting region and to divide the metal layer. A plurality of regions (large regions) of the metal layer divided by the slit each include a partial region (small region) of the opposite region. The area of each large region is set corresponding to the area of the small region included therein. Specifically, the small region having the area of A [%] with respect to the whole area of the opposite region is included in the large region having the area of (A±δ) [%] with respect to the whole area of the metal layer. Here, δ is an acceptable error range, and the acceptable error range δ is not more than (A×0.3).

6 Claims, 12 Drawing Sheets

(a) INVENTIVE EXAMPLE 6

(b) INVENTIVE EXAMPLE 7

(a) COMPARATIVE EXAMPLE 1

(b) COMPARATIVE EXAMPLE 2

(c) COMPARATIVE EXAMPLE 3

PRINTED CIRCUIT BOARD AND METHOD OF MANUFACTURING THE SAME

BACKGROUND OF THE INVENTION

1. Field of the Invention

The present invention relates to a printed circuit board and a method of manufacturing the same.

2. Description of the Background Art

Conventionally, a COF (Chip On Film) mounting technique has been known as a technique for mounting electronic components such as an LSI (Large Scale Integration) on a film-like substrate. In general, the substrate for COF (hereinafter referred to as the COF substrate) has a two-layer structure of an insulating layer made of polyimide and conductive traces made of copper. Terminals are formed on the conductive traces. Terminals (bumps) of the electronic components are bonded to the terminals of the conductive traces.

With finer pitches of the COF substrate and higher performance of the electronic components, heating values during operation of the electronic components increase. This causes problems such as a malfunction of the electronic components in some cases; therefore, it is important to carry out sufficient heat dissipation. Thus, it has been proposed to provide a metal layer for heat dissipation on a back surface (a surface to which the electronic components are not bonded) of the insulating layer of the COF substrate.

In a tape circuit board disclosed in JP 2007-27682 A, for example, the metal layer is formed, below a chip mounting region, on a lower surface of a base film.

FIG. 12 is a schematic sectional view of a conventional COF substrate provided with the metal layer. In the COF substrate 200 of FIG. 12, conductor traces 52 are provided on one surface of the insulating layer 51 while the metal layer 53 is provided on the other surface. Bumps 55a of an electronic component 55 are bonded to terminals of the conductor traces 52. Such a configuration allows heat of the electronic component 55 to be dissipated through the metal layer 53.

The electronic component 55 is connected to the terminals of the conductor traces 52 by thermocompression bonding, for example. In the case, the insulating layer 51 and the metal layer 53 of the COF substrate 200 are expanded by heat. In addition, the insulating layer 51 and the metal layer 53 are also expanded by heat generated by the electronic component 55 during the operation of the electronic component 55.

Distances between the bumps 55a of the electronic component 55 are much smaller than an expansion volume of the metal layer 53. Therefore, stresses are applied to the terminals of the conductor traces 52 when the insulating layer 51 and the metal layer 53 are expanded.

Since the insulating layer 53 is flexed in the case of no metal layer 53 provided, the stresses applied to the terminals are relieved. When the metal layer 53 is provided, however, the insulating layer 51 is unlikely to be flexed, thus not relieving the stresses applied to the terminals.

As a result, the conductor traces 52 are stripped from the insulating layer, or the terminals of the conductor traces 52 are separated from the bumps 55a of the electronic component 55 in some cases.

SUMMARY OF THE INVENTION

An object of the present invention is to provide a printed circuit board with sufficient heat dissipation and improved connectivity to an electronic component and a method of manufacturing the same.

(1) According to an aspect of the present invention, a printed circuit board on which an electronic component is to be mounted includes a base insulating layer, a conductor trace that is formed on one surface of the base insulating layer and has a terminal to be electrically connected to the electronic component, a cover insulating layer that has an opening causing the terminal of the conductor trace to be exposed and is formed on the one surface of the base insulating layer to cover the conductor trace excluding a portion below the opening, and a metal layer formed on the other surface of the base insulating layer, wherein the metal layer includes a opposite region that coincides with the opening of the cover insulating layer, and a stress relief region that contains the opposite region and is larger than the opposite region, one or plurality of slits are formed in the metal layer to divide the opposite region into a plurality of small regions and divide the stress relief region into a plurality of large regions including the small regions, respectively, and when a ratio of an area of one of the small regions with respect to a whole area of the opposite region is A %, a ratio of an area of the large region including the one small region with respect to a whole area of the stress relief region is set to not less than (A−α) % and not more than (A+α) %, the α being not more than (A×0.3).

In the printed circuit board, the conductor trace having the terminal is formed on the one surface of the base insulating layer. The terminal of the conductor trace is exposed on an inner side of the opening of the cover insulating layer. The electronic component is electrically connected to the terminal of the conductor trace on the inner side of the opening of the cover insulating layer. The metal layer is formed on the other surface of the base insulating layer. Heat generated in the electronic component is dissipated through the metal layer.

The base insulating layer and the metal layer are thermally expanded at the time of thermocompression bonding and operation of the electronic component. In the case, the base insulating layer expands to follow the expansion of the metal layer. Therefore, one or plurality of slits are formed in the opposite region, which coincides with the opening of the cover insulating layer, of the metal layer. Accordingly, a stress, which is applied to the conductor trace at the time of thermal expansion of the base insulating layer and the metal layer, is relieved. This improves connectivity between the conductor trace and the electronic component.

In addition, the opposite region of the metal layer is divided into the plurality of small regions by the slit while the stress relief region containing the opposite region is divided into the plurality of large regions including the small regions, respectively. When the ratio of the area of one small region with respect to the whole area of the opposite region is A %, the ratio of the area of the large region including the one small region with respect to the whole area of the stress relief region is set to not less than (A−α) % and not more than (A+α) %.

In this case, an area ratio among the plurality of large regions and an area ratio among the small regions included in the large regions are substantially equal. Therefore, heat generated in the electronic component is uniformly transmitted to the plurality of large regions of the metal layer. This allows the heat generated in the electronic component to be efficiently dissipated. This reliably prevents the heat from staying in the electronic component and its surroundings. As a result, a malfunction of the electronic component can be reliably prevented.

(2) A periphery of the stress relief region may be on an outer side of a periphery of the opposite region by not less than 2 mm.

In this case, the slits are formed to extend to the outer side of the periphery of the opposite region by not less than 2 mm.

Thus, a stress applied to the conductor trace at the time of thermal expansion of the base insulating layer and the metal layer is sufficiently relieved.

(3) An area of the stress relief region may be equal to the area of the metal layer. In this case, the slits are formed to divide the metal layer. Thus, a stress applied to the conductor trace at the time of thermal expansion of the base insulating layer and the metal layer is sufficiently relieved.

(4) The area of the metal layer may be at least three times as large as the area of the opposite region. In this case, heat generated in the electronic component is sufficiently dissipated, thus more reliably preventing the heat from staying in the electronic component and its surroundings.

(5) The opposite region may have a rectangular shape, and the one or plurality of slits may be formed to cross the opposite region along any of sides of the opposite region. In this case, a stress applied to the conductor trace at the time of the thermal expansion of the base insulating layer and the metal layer is reliably relieved with simple configuration.

(6) According to another aspect of the present invention, a method of manufacturing a printed circuit board on which an electronic component is to be mounted includes the steps of forming a conductor trace having a terminal to be electrically connected to the electronic component on one surface of a base insulating layer, forming on the one surface of the base insulating layer a cover insulating layer that has an opening causing the terminal of the conductor trace to be exposed and covers the conductor trace excluding a portion below the opening, forming on the other surface of the base insulating layer a metal layer including a opposite region that coincides with the opening of the cover insulating layer, and a stress relief region that contains the opposite region and is larger than the opposite region, and forming one or plurality of slits in the metal layer to divide the opposite region into a plurality of small regions and divide the stress relief region into a plurality of large regions including the small regions, respectively, and when a ratio of an area of one of the small regions with respect to a whole area of the opposite region is A %, a ratio of an area of the large region including the one small region with respect to a whole area of the stress relief region is set to not less than $(A-\alpha)$ % and not more than $(A+\alpha)$ %, the $\alpha$ being not more than $(A \times 0.3)$.

In the method of manufacturing the printed circuit board, the conductor trace having the terminal is formed on the one surface of the base insulating layer. The terminal of the conductor trace is exposed on the inner side of the opening of the cover insulating layer. The electronic component is electrically connected to the terminal of the conductor trace on the inner side of the opening of the cover insulating layer. The metal layer is formed on the other surface of the base insulating layer. Heat generated in the electronic component is dissipated through the metal layer.

The base insulating layer and the metal layer are thermally expanded at the time of thermocompression bonding and operation of the electronic component. In the case, the base insulating layer expands to follow the expansion of the metal layer. Therefore, the one or plurality of slits are formed in the opposite region, which coincides with the opening of the cover insulating layer, of the metal layer. Accordingly, a stress, which is applied to the conductor trace at the time of thermal expansion of the base insulating layer and the metal layer, is relieved. This improves connectivity between the conductor trace and the electronic component.

In addition, the opposite region is divided into the plurality of small regions by the slits while the stress relief region containing the opposite region is divided into the plurality of large regions including the small regions, respectively. When the ratio of the area of the one small region with respect to the whole area of the opposite region is A %, the ratio of the area of the large region including the one small region with respect to the whole area of the stress relief region is set to not less than $(A-\alpha)$ % and not more than $(A+\alpha)$ %.

In this case, the area ratio among the plurality of large regions and the area ratio among the small regions included in the large regions are substantially equal. Therefore, heat generated in the electronic component is uniformly transmitted to the plurality of large regions of the metal layer. This allows the heat generated in the electronic component to be efficiently dissipated. This reliably prevents the heat from staying in the electronic component and its surroundings. As a result, a malfunction of the electronic component can be reliably prevented.

According to the present invention, the stress applied to the conductor trace at the time of the thermal expansion of the base insulating layer and the metal layer is relieved. This improves connectivity between the conductor trace and the electronic component. Moreover, the heat generated in the electronic component can be efficiently dissipated and the heat can be reliably prevented from staying in the electronic component and its surroundings. As a result, a malfunction of the electronic component can be reliably prevented.

Other features, elements, characteristics, and advantages of the present invention will become more apparent from the following description of preferred embodiments of the present invention with reference to the attached drawings.

DESCRIPTION OF THE PREFERRED EMBODIMENTS

Figure 1:
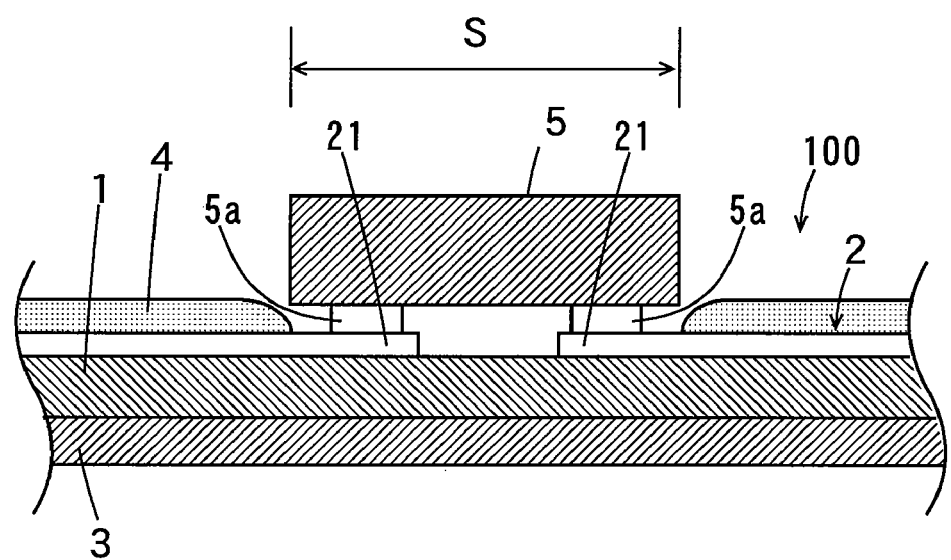
FIG. 1 is a sectional view of a COF substrate according to the present embodiment.

Hereinafter, a printed circuit board and a method of manufacturing the same according to one embodiment of the present invention will be described while referring to the drawings. Note that a substrate for COF (Chip On Film)

(hereinafter referred to as a COF substrate) is described as one example of the printed circuit board in the present embodiment.

(1) Configuration

Figure 2:
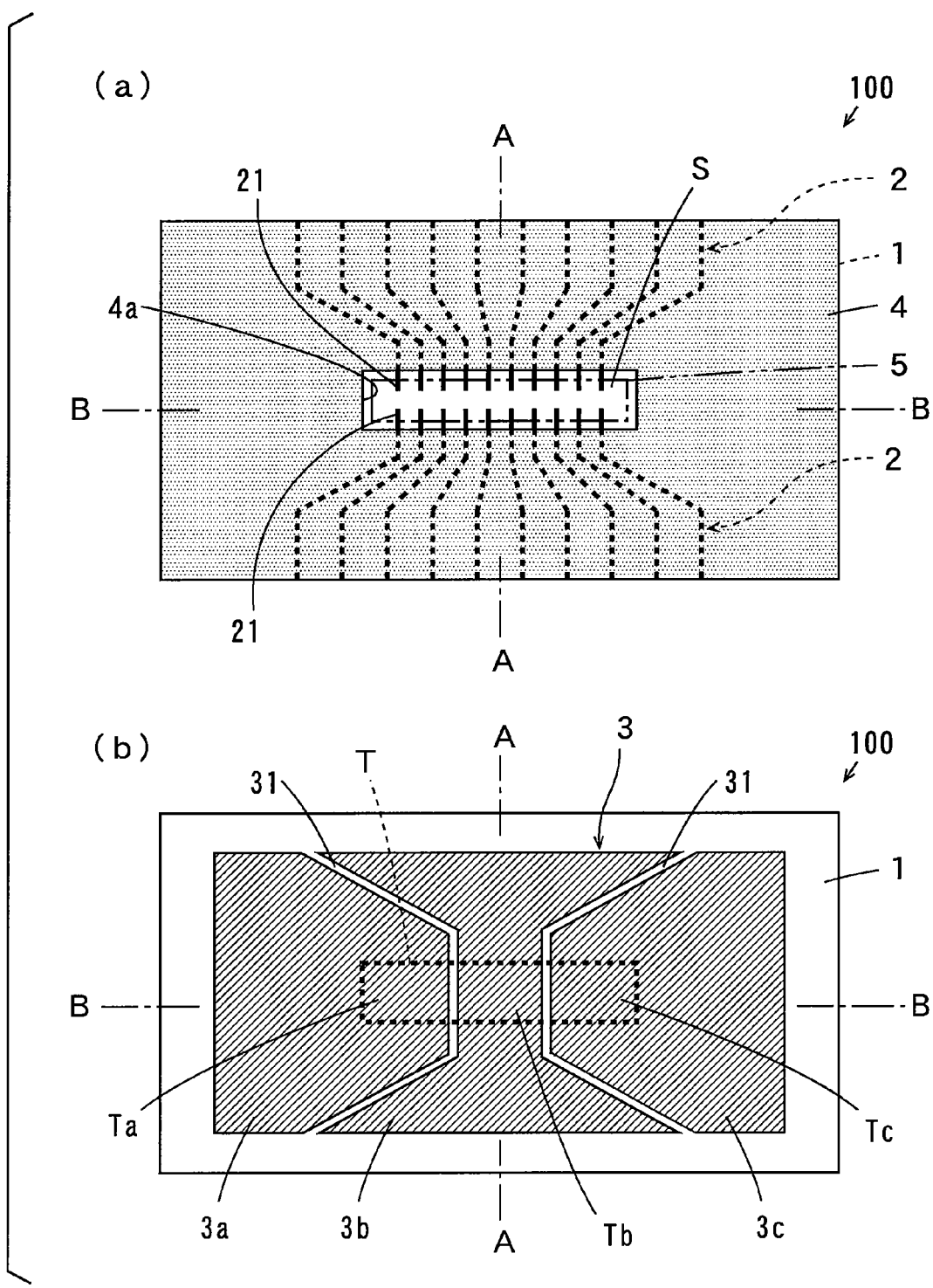
FIG. 2 is a plan view of the COF substrate according to the present embodiment.

FIG. 1 is a sectional view of the COF substrate according to the present embodiment, and FIG. 2 is a plan view of the COF substrate according to the present embodiment. Note that FIG. 2 (a) shows an upper surface of the COF substrate of FIG. 1, and FIG. 2 (b) shows a lower surface of the COF substrate of FIG. 1. The sectional view taken along the line A-A of FIGS. 2 (a) and (b) corresponds to the sectional view of FIG. 1.

As shown in FIGS. 1 and 2, the COF substrate 100 includes an insulating layer 1 made of polyimide, for example. A mounting region S is provided at an approximately center of one surface of the insulating layer 1. In this example, the mounting region S has a rectangular shape.

Conductor traces 2 made of copper, for example, are formed to outwardly extend from inside of the mounting region S. Note that the conductor traces 2 include signal lines for transmitting electrical signals and dummy lines not transmitting electrical signals. A cover insulating layer 4 made of polyimide, for example, is formed on the one surface of the insulating layer 1 to cover the conductor traces 2. An opening 4a is formed in a portion of the cover insulating layer 4 above the mounting region S. Terminals 21 of the conductor traces 2 are arranged on the inner side of the opening 4a.

An electronic component 5 (an LSI (Large Scale Integration), for example) is mounted on the mounting region S. Specifically, bumps 5a (FIG. 1) of the electronic component 5 are bonded to the terminals 21 of the conductor traces 2 by thermocompression bonding, for example.

As shown in FIG. 2 (b), a metal layer 3 made of copper, for example, is provided on the other surface of the insulating layer 1. Slits 31 are formed to cross a region, which coincides with the mounting region S, of the metal layer 3 (hereinafter referred to as an opposite region T) and divide the metal layer 3.

A plurality of regions, which are divided by the slits 31, of the metal layer 3 (hereinafter referred to as large regions) include partial regions constituting the opposite region T (hereinafter referred to as small regions), respectively. The area of each of the large regions is set corresponding to the area of the small region included therein.

Specifically, the small region having the area of A [%] with respect to the whole area of the opposite region T is included in the large region having the area of (A±δ) [%] with respect to the whole area of the metal layer 3. Here, δ represents an acceptable error range, and the acceptable error range δ is not more than (A×0.3). That is, each large region has the area of a range of not less than (A×0.7) [%] to not more than (A×1.3) [%] of the whole area of the metal layer 3 in the foregoing example.

Particularly, the acceptable error range δ is preferably not more than (A×0.2), more preferably not more than (A×0.1), and still more preferably not more than (A×0.05).

In addition, the size relationship among the plurality of small regions is preferably equal to the size relationship among the large regions corresponding thereto. For example, when the size relationship among the plurality of small regions T1, T2, . . . Tn is T1≧T2≧ . . . ≧Tn, the size relationship among the large regions D1, D2, . . . Dn including the small regions T1, T2, . . . Tn, respectively, is preferably D1≧D2≧ . . . ≧Dn.

In this manner, the area ratio among the plurality of large regions and the area ratio among the small regions included therein are set substantially equal.

In this example, the two slits 31 are formed in the metal layer 3. Each slit 31 crosses the opposite region T to vertically intersect with a pair of longer sides of the opposite region T, and extends on both sides of the opposite region T toward a pair of longer sides of the metal layer 3 to be gradually away from the other slit 31. Thus, the metal layer 3 is divided into the large regions 3a, 3b, 3c. The large regions 3a, 3b, 3c of the metal layer 3 include the small regions Ta, Tb, Tc of the opposite region T, respectively.

The area ratio among the large regions 3a, 3b, 3c is approximately 1:1:1, and the area ratio among the small regions Ta, Tb, Tc is approximately 1:1:1. That is, the area ratio among the large regions 3a, 3b, 3c of the metal layer 3 is approximately equal to the area ratio among the small regions Ta, Tb, Tc.

In the COF substrate 100, heat generated in the electronic component 5 is transmitted to the metal layer 3 through the insulating layer 1 to be dissipated. In the case, heat generated above the small region Ta of the opposite region T is dissipated through the large region 3a of the metal layer 3, heat generated above the small region Tb is dissipated through the large region 3b of the metal layer 3, and heat generated above the small region Tc is dissipated through the large region 3c of the metal layer 3.

As described above, the area ratio among the large regions 3a, 3b, 3c of the metal layer 3 is approximately equal to the area ratio among the small regions Ta, Tb, Tc, so that the heat generated in the electronic component 5 is substantially equally transmitted to the whole metal layer 3. This causes the heat generated in the electronic component 5 to be efficiently dissipated.

(2) Expansion Of The Insulating Layer And The Metal Layer

At the time of the thermocompression bonding or operation of the electronic component 5, heat is applied to the insulating layer 1 and the metal layer 3 of the COF substrate 100. This causes the insulating layer 1 and the metal layer 3 to be thermally expanded. In this case, the insulating layer 1 is expanded to follow the expansion of the metal layer 3 having high rigidity.

Figure 3:
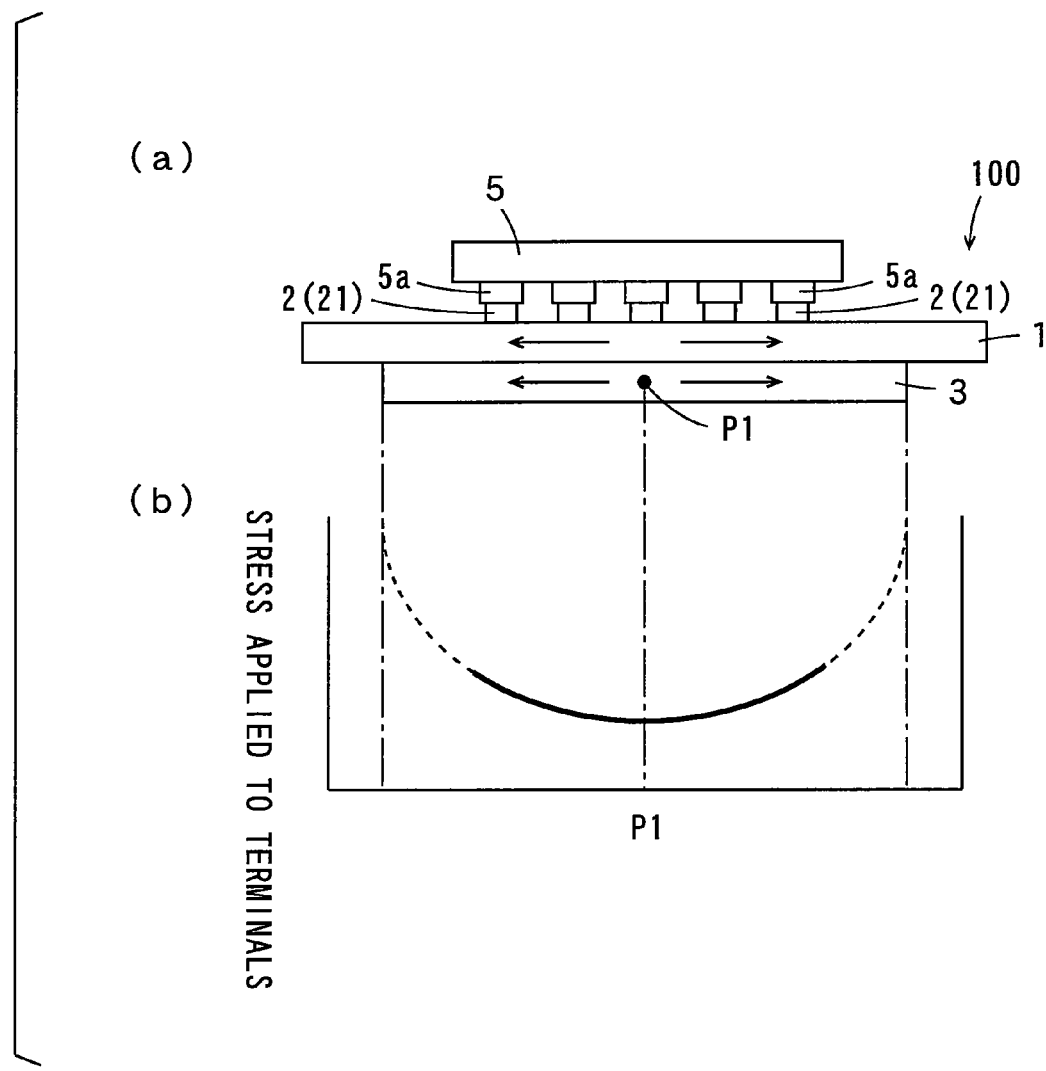
FIG. 3 is a diagram showing change of an insulating layer and a metal layer at the time of thermal expansion.
Figure 4:
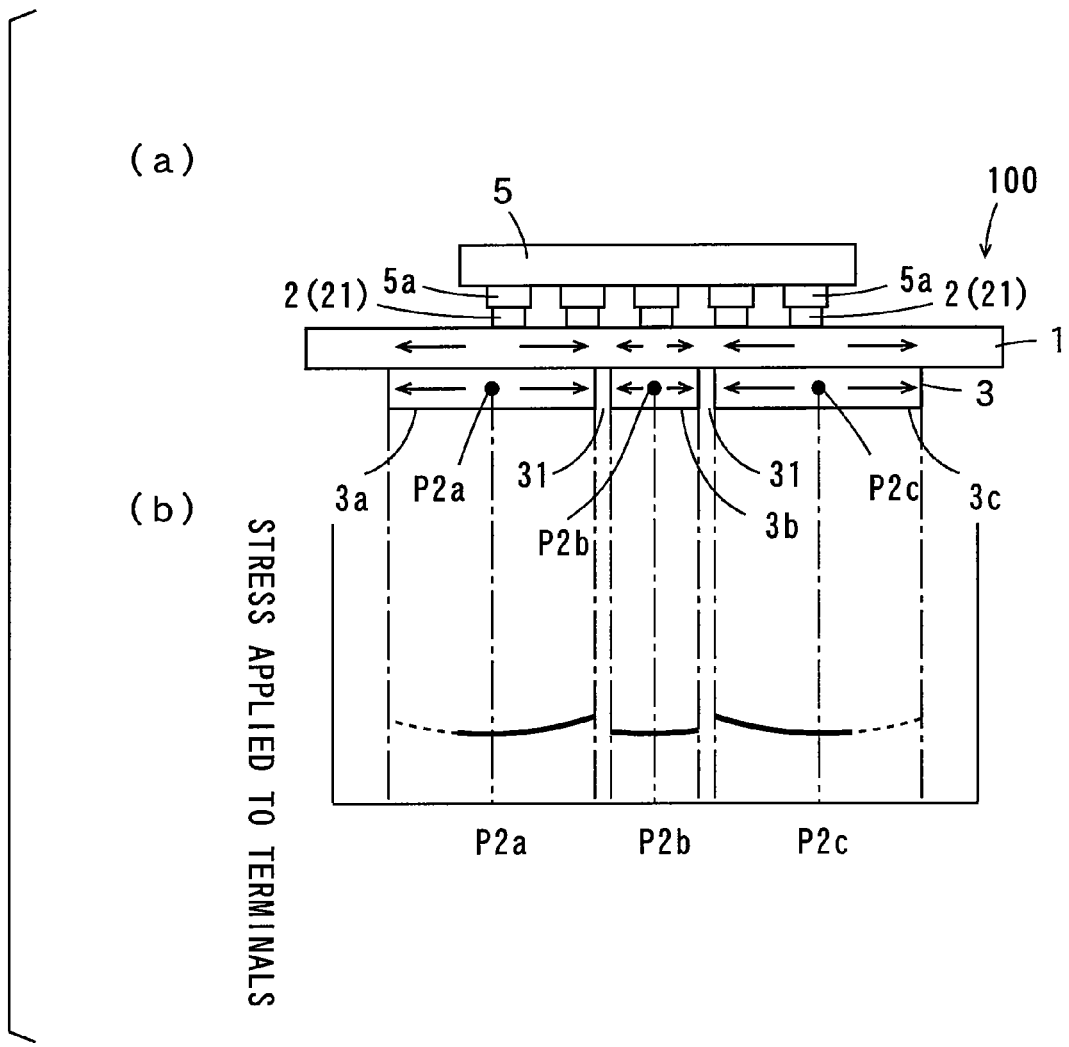
FIG. 4 is a diagram showing change of the insulating layer and the metal layer at the time of thermal expansion.

FIGS. 3 and 4 are diagrams schematically showing change of the insulating layer 1 and the metal layer 3 at the time of thermal expansion. FIGS. 3 (a) and (b) show the change of the insulating layer 1 and the metal layer 3 when the slits 31 are not formed in the metal layer 3, and FIGS. 4 (a) and (b) show the change of the insulating layer 1 and the metal layer 3 when the slits 31 are formed in the metal layer 3.

Note that FIG. 3 (a) and FIG. 4 (a) show schematic side views of the COF substrate 100, and FIG. 3 (b) and FIG. 4 (b) schematically show stresses applied to the terminals 21 of the conductor traces 2. In FIG. 3 (b) and FIG. 4 (b), the abscissas indicate the position of the metal layer 3 in the width direction while the ordinates indicate the stresses applied to the terminals 21 of the conductor traces 2.

As shown in FIG. 3 (a), application of heat causes the metal layer 3 to be expanded to outwardly extend. With the expansion of the metal layer 3, the insulating layer 1 is expanded to outwardly extend. Distances between the bumps 5a of the electronic component 5 are much smaller than the expansion volume of the metal layer 3. Therefore, intervals between the terminals 21 of the conductor traces 2 are maintained much smaller than the expansion volume of the metal layer 3.

Thus, stresses (shear stresses) in a direction parallel to the one surface of the insulating layer 1 are applied to the terminals 21 of the conductor traces 2. Here, since the expansion of the insulating layer 1 follows the expansion of the metal layer 3, the stresses applied to the terminals 21 become larger as the distance from the center P1 of the metal layer 3 increases in a region overlapping with the metal layer 3, as shown in FIG. 3 (b).

When the metal layer 3 is formed to cover a region opposite to the electronic component 5; that is, the slits 31 are not formed in the metal layer 3, significantly large stresses are applied to the terminals 21 positioned far from the center P1 of the metal layer 3.

On the contrary, when the metal layer 3 is divided into the large regions 3a, 3b, 3c by the slits 31, the metal layer 3 is expanded to outwardly extend in each of the large regions 3a, 3b, 3c as shown in FIG. 4 (a). In this case, the stresses applied to the terminals 21 are dependent on the distances from the center P2a, P2b, P2c in each of the large regions 3a, 3b, 3c, as shown in FIG. 4 (b).

In the large regions 3a, 3b, 3c, the distances between ends thereof and the center P2a, P2b, P2c are each smaller than the distances between ends of the metal layer 3 and the center P1 of FIG. 3 (a). This prevents the significantly large stresses from being applied to part of the terminals 21, relieving the stresses as a whole applied to the terminals 21.

When the width of the slit 31 is not more than 50 μm, the stresses applied to the terminal 21 at the time of thermal expansion of the insulating layer 1 and the metal layer 3 cannot be sufficiently relieved. In addition, when the width of the slit 31 is not less than 500 μm, heat generated in the electronic component 5 cannot be sufficiently dissipated. Accordingly, the width of the slit 31 is preferably larger than 50 μm and smaller than 500 μm.

(3) Manufacturing Method

Figure 5:
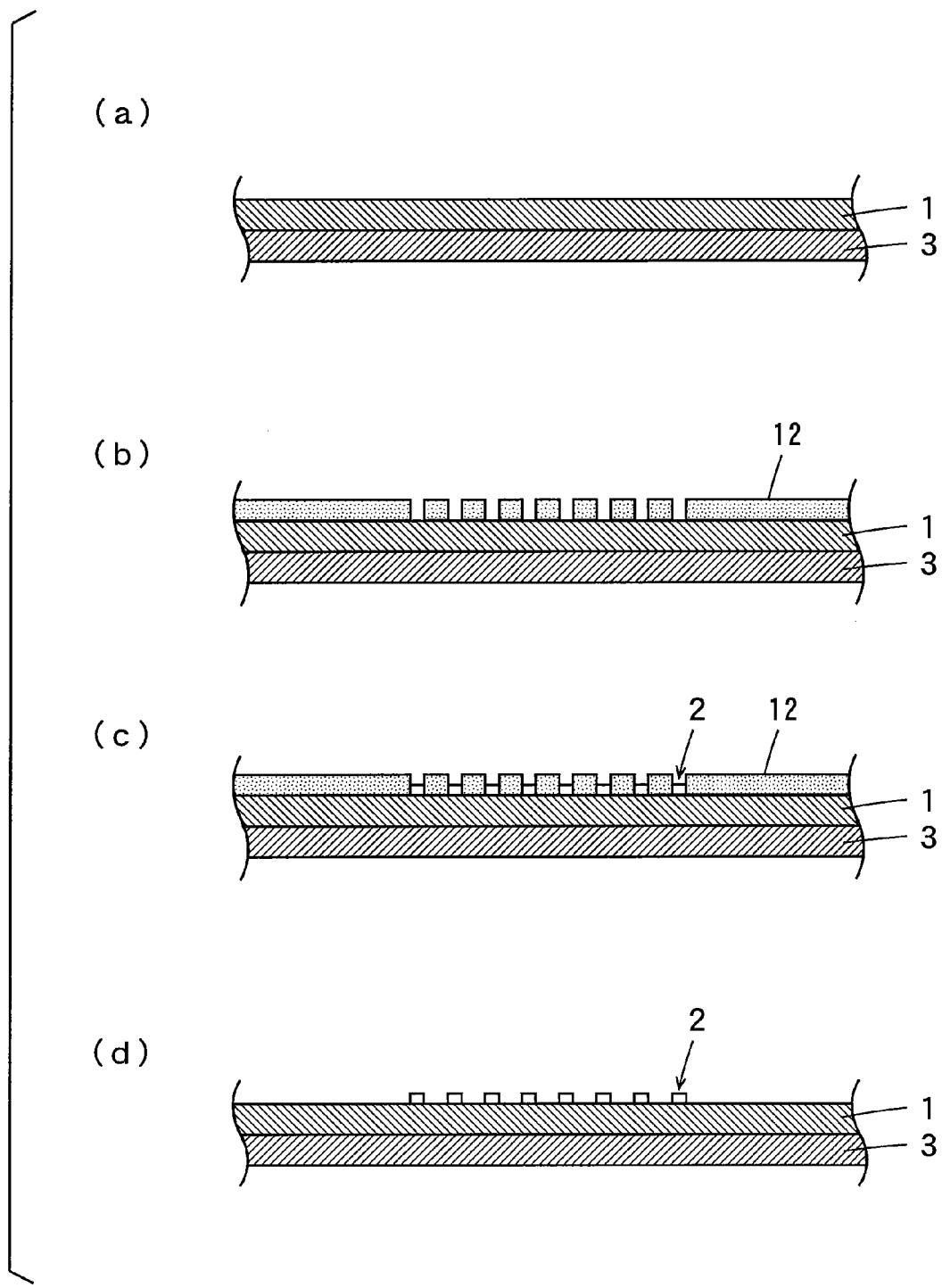
FIG. 5 is a sectional view for explaining steps in a method of manufacturing the COF substrate according to the present embodiment.
Figure 6:
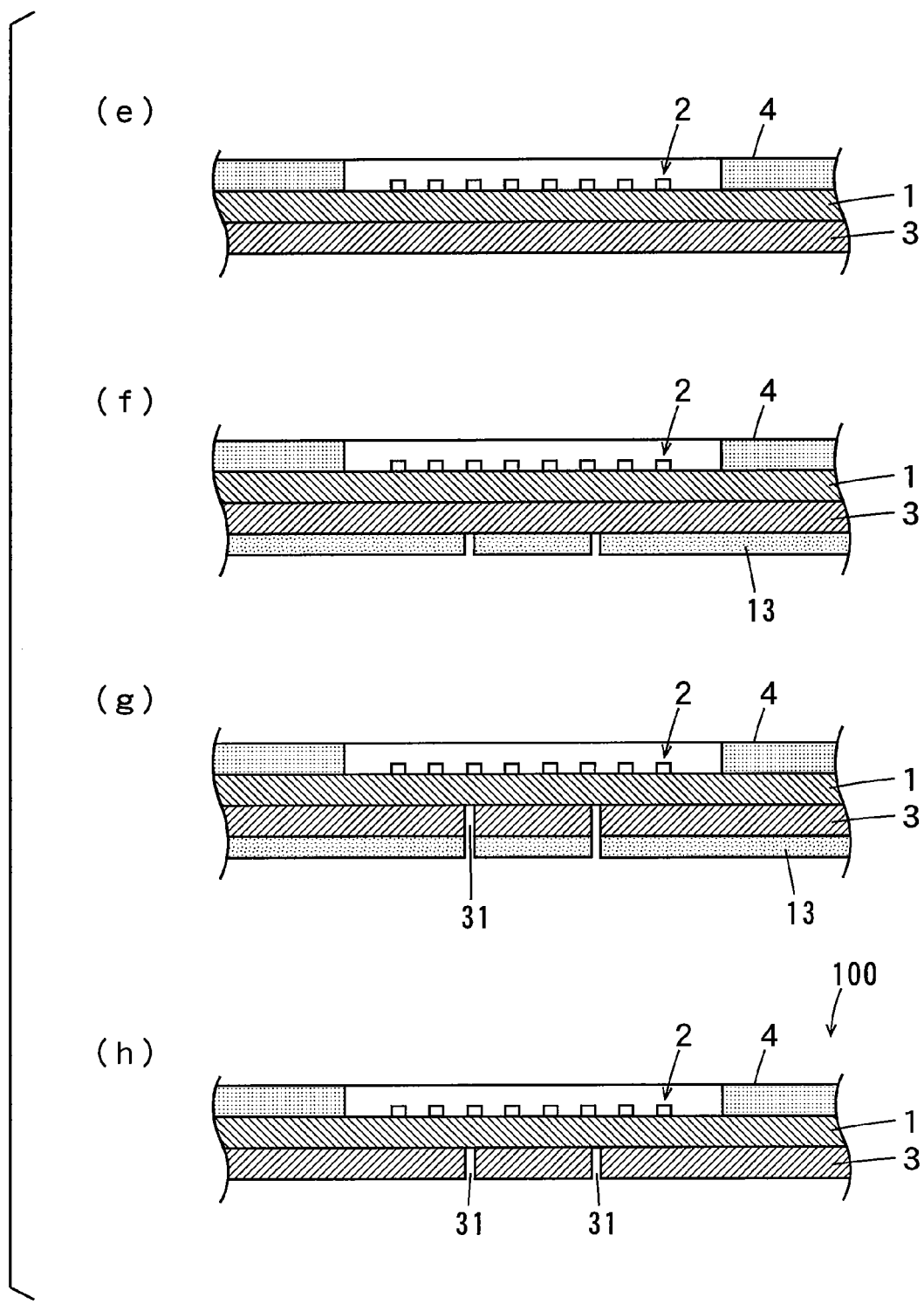
FIG. 6 is a sectional view for explaining steps in the method of manufacturing the COF substrate according to the present embodiment.

Next, description is made of one example of the method of manufacturing the COF substrate 100 according to the present embodiment. FIGS. 5 and 6 are sectional views for explaining steps in the method of manufacturing the COF substrate 100 according to the present embodiment. The cross section shown in FIGS. 5 and 6 corresponds to the cross section taken along the line B-B of FIG. 2.

As shown in FIG. 5 (a), a two-layer base material composed of polyimide and copper is prepared. This two-layer base material corresponds to the insulating layer 1 and the metal layer 3 of the COF substrate 100.

First, a thin metal film (not shown) is formed by sputtering on an upper surface of the insulating layer 1. Then, a dry film resist 12 having a reverse pattern of the conductor traces 2 (FIG. 1) is formed on the thin metal film as shown in FIG. 5 (b). The reverse pattern is formed by exposure and development of the dry film resist 12.

Then, the conductor traces 2 are formed by electrolytic plating on exposed portions of the insulating layer 1 (exposed portions of the thin metal film) as shown in FIG. 5 (c). Then, the dry film resist 12 is removed by a stripping liquid while a region, under the dry film resist 12, of the thin metal film is removed by etching as shown in FIG. 5 (d).

Electroless tin plating is subsequently performed on surfaces of the conductor traces 2 as surface treatment for connection with the electronic component 5. Then, the cover insulating layer 4 is formed to cover a predetermined region of the conductor traces 2 as shown in FIG. 6 (e).

Next, a dry film resist 13 is formed on a lower surface of the metal layer excluding regions in which the slits are to be formed, as shown in FIG. 6 (f). Then, exposed portions of the metal layer 3 are etched to form the slits 31 as shown in FIG. 6 (g). After that, the dry film resist 13 is removed by the stripping liquid as shown in FIG. 6 (h). In this manner, the COF substrate 100 according to the present embodiment is completed.

While a semi-additive method by which the conductor traces 2 are formed is described as an example, the conductor traces 2 may be formed by a subtractive method.

(4) Effects Of The Embodiment

The slits 31 are formed to cross the region opposite to the electronic component 5 to divide the metal layer 3 in the present embodiment. This relieves the stresses as a whole applied to the terminals 21. As a result, connectivity between the bumps 5a of the electronic component 5 and the terminals 21 of the conductor traces 2 is improved.

Moreover, in the present embodiment, the area ratio among the large regions 3a, 3b, 3c of the metal layer 3 is set substantially equal to the area ratio among the small regions Ta, Tb, Tc. Accordingly, the heat generated in the electronic component 5 can be efficiently dissipated. This reliably prevents the heat from staying in the electronic component 5 and its surroundings. As a result, a malfunction of the electronic component 5 can be reliably prevented.

(5) Modifications Of The Slit

Figure 7:
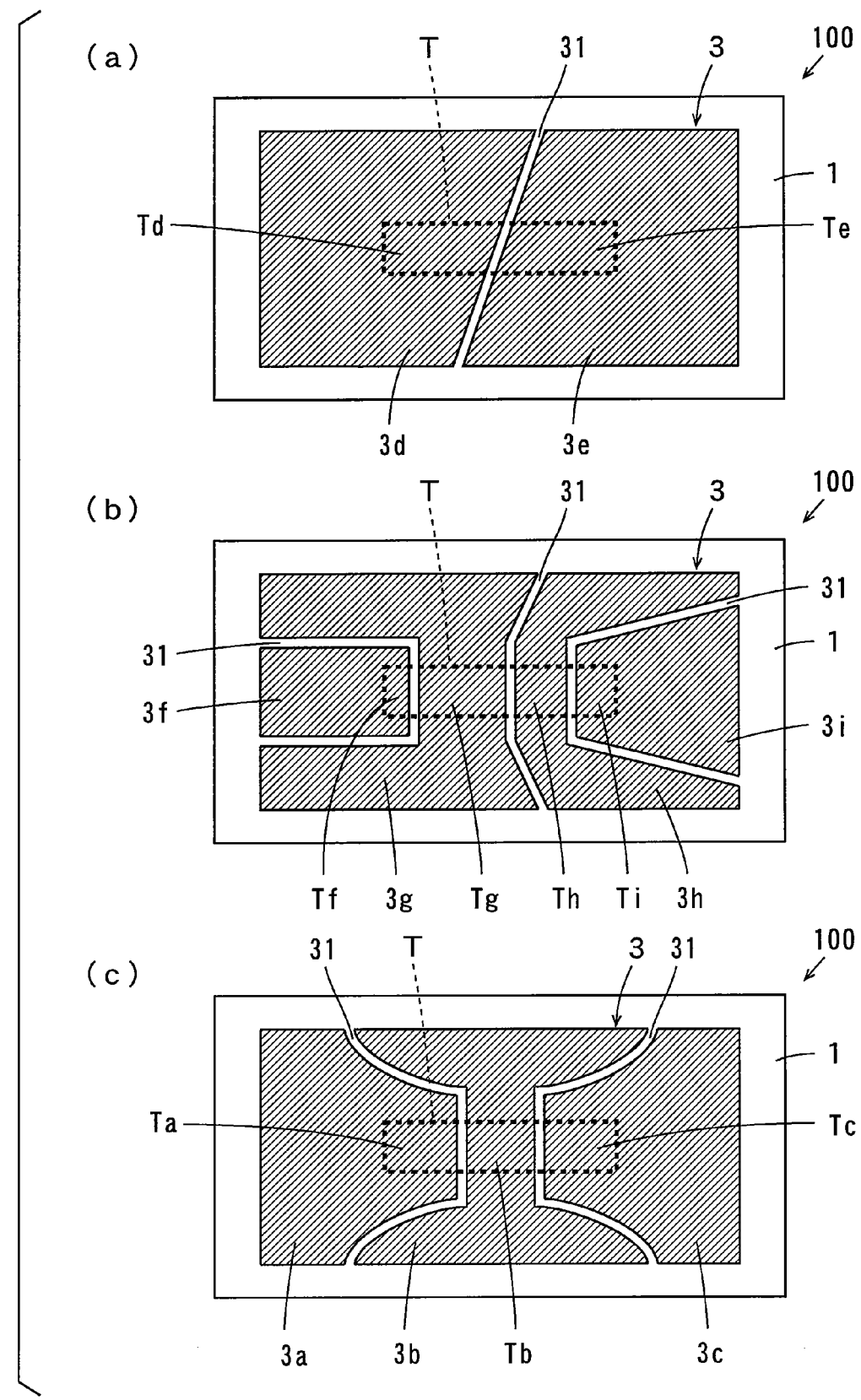
FIG. 7 is a diagram showing modifications of slits formed in the metal layer.
Figure 8:
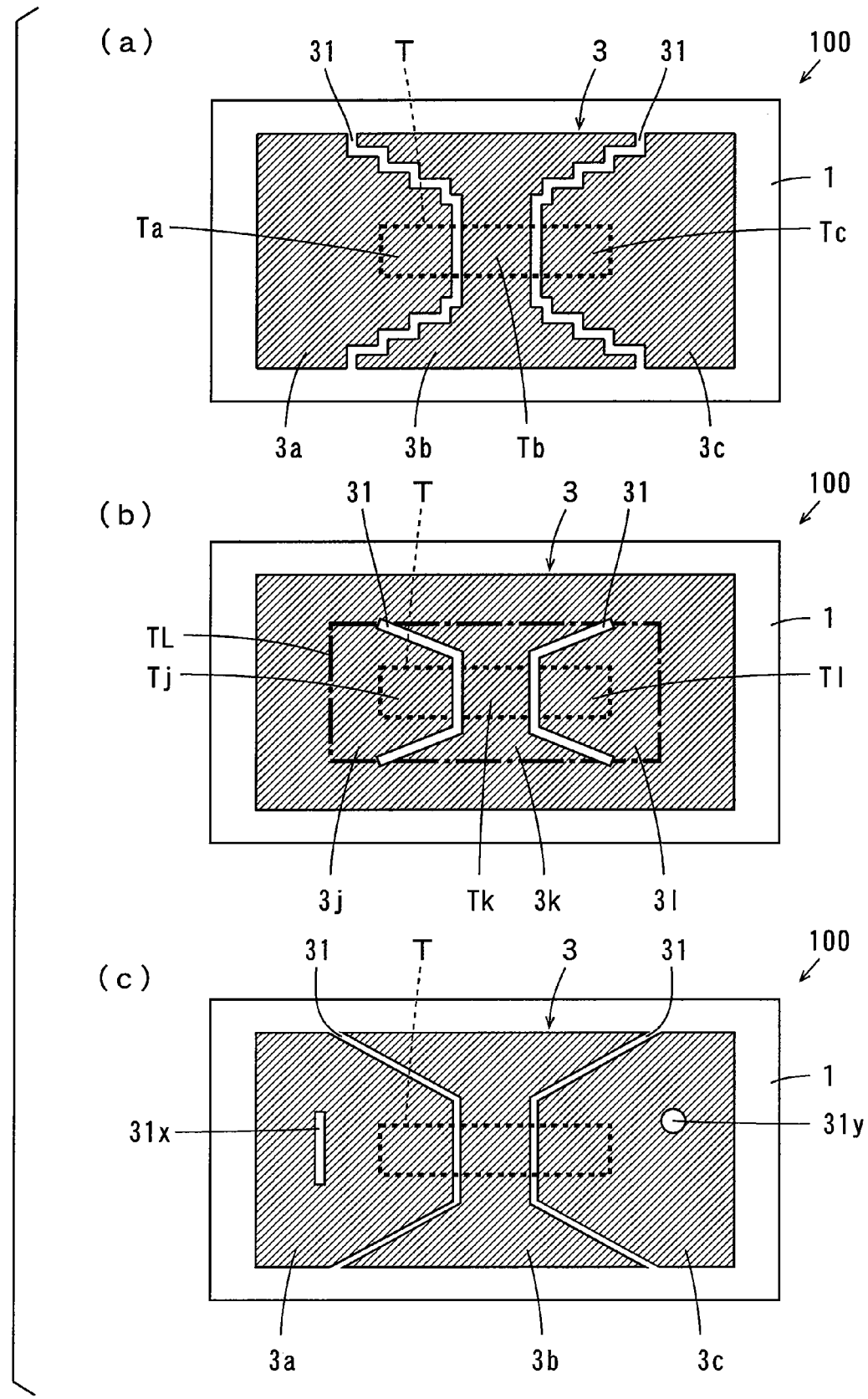
FIG. 8 is a diagram showing modifications of the slits formed in the metal layer.

The arrangement and shape of the slits 31 formed in the metal layer 3 are not limited to the above-described example. FIGS. 7 and 8 are plan views showing modifications of the slits 31 formed in the metal layer 3.

(5-1)

While the two slits 31 are formed in the metal layer 3 in the foregoing embodiment, only one slit 31 may be formed.

In the example of FIG. 7 (a), the metal layer 3 is divided into large regions 3d, 3e by the slit 31. The large regions 3d, 3e include small regions Td, Te of the opposite region T, respectively.

When the ratios of the areas of the small regions Td, Te with respect to the whole area of the opposite region T are A1 [%] and A2 [%], respectively, the ratios of the areas of the large regions 3d, 3e with respect to the whole area of the metal layer 3 are set to (A1±δ) [%] and (A2±δ) [%], respectively. That is, the area ratio between the large regions 3d, 3e is substantially equal to the area ratio between the small regions Td, Te.

Also in this case, connectivity between the terminals 21 of the conductor traces 2 the bumps 5a of the electronic component 5 can be improved while heat dissipation is sufficiently ensured.

(5-2)

Three or more slits 31 may be formed in the metal layer 3.

In the example of FIG. 7 (b), the metal layer 3 is divided into large regions 3f, 3g, 3h, 3i by the three slits 31. The large regions 3f, 3g, 3h, 3i include small regions Tf, Tg, Th, Ti, respectively, of the opposite region T.

When the ratios of the areas of the small regions Tf, Tg, Th, Ti with respect to the whole area of the opposite region T are A3 [%], A4 [%], A5 [%] and A6 [%], respectively, the ratios of the areas of the large regions 3f, 3g, 3h, 3i with respect to the whole area of the metal layer 3 are set to (A3±δ) [%], (A4±δ) [%], (A5±δ) [%] and (A6±δ) [%], respectively. That is, the area ratio among the large regions 3f, 3g, 3h, 3i is substantially equal to the area ratio among the small regions Tf, Tg, Th, Ti.

Also in this case, connectivity between the terminals 21 of the conductor traces 2 and the bumps 5a of the electronic component 5 can be improved while heat dissipation is sufficiently ensured.

(5-3)

While the slits 31 are linearly formed in the foregoing embodiments, the slits 31 may be formed in curved shapes as shown in FIG. 7 (c).

Also in this case, connectivity between the terminals 21 of the conductor traces 2 the bumps 5a of the electronic component 5 can be improved while heat dissipation is sufficiently ensured.

(5-4)

As shown in FIG. 8 (a), the slits 31 may be formed to be continuously bent.

Also in this case, connectivity between the terminals 21 of the conductor traces 2 and the bumps 5a of the electronic component 5 can be improved while heat dissipation is sufficiently ensured.

(5-5)

While the slits 31 are formed to divide the metal layer 3 in the foregoing embodiments, the metal layer 3 may not be divided by the slits 31 as shown in FIG. 8 (b). That is, in the COF substrate 100 of FIG. 8 (b), the plurality of large regions are linked to one another in the vicinity of the periphery of the metal layer 3.

Also in this case, connectivity between the terminals 21 of the conductor traces 2 and the bumps 5a of the electronic component 5 can be improved while heat dissipation is sufficiently ensured.

Note that each slit 31 is formed such that its one end and other end are positioned on the outer side of the periphery of the opposite region T by at least 2 mm in order to sufficiently relieve the stresses applied to the terminals 21 at the time of the thermal expansion of the insulating layer 1 and the metal layer 3. In FIG. 8 (b), the one-dot and dash line TL indicates a position outwardly spaced apart from the periphery of the opposite region T by 2 mm.

In this case, a region of the metal layer 3 on the inner side of the one-dot and dash line TL is divided into medium regions 3j, 3k, 3l by the slits 31. The medium regions 3j, 3k, 3l include the small regions Tj, Tk, Tl of the opposite region T, respectively.

When the ratios of the areas of the small regions Tj, Tk, Tl with respect to the whole area of the opposite region T are A7 [%], A8 [%] and A9 [%], respectively, ratios of the areas of the medium regions 3j, 3k, 3l with respect to the whole area of the region on the inner side of the one-dot and dash line TL are set to (A7±δ) [%], (A8±δ) [%], (A9±δ) [%], respectively. The area ratio among the medium regions 3j, 3k, 3l are substantially equal to the area ratio among the small regions Tj, Tk, Tl.

(5-6)

As shown in FIG. 8 (c), another slit 31x, a hole 31y or the like may be formed in a region of the metal layer 3 excluding the opposite region T so as not to divide the large regions 3a, 3b, 3c.

(5-7)

The size of the metal layer 3 may be suitably changed. Note that the area of the metal layer 3 is preferably at least three times as large as the area of the opposite region T in order to ensure sufficient heat dissipation.

(6) Inventive Example And Comparative Examples (6-1) Inventive Example 1

Figure 9:
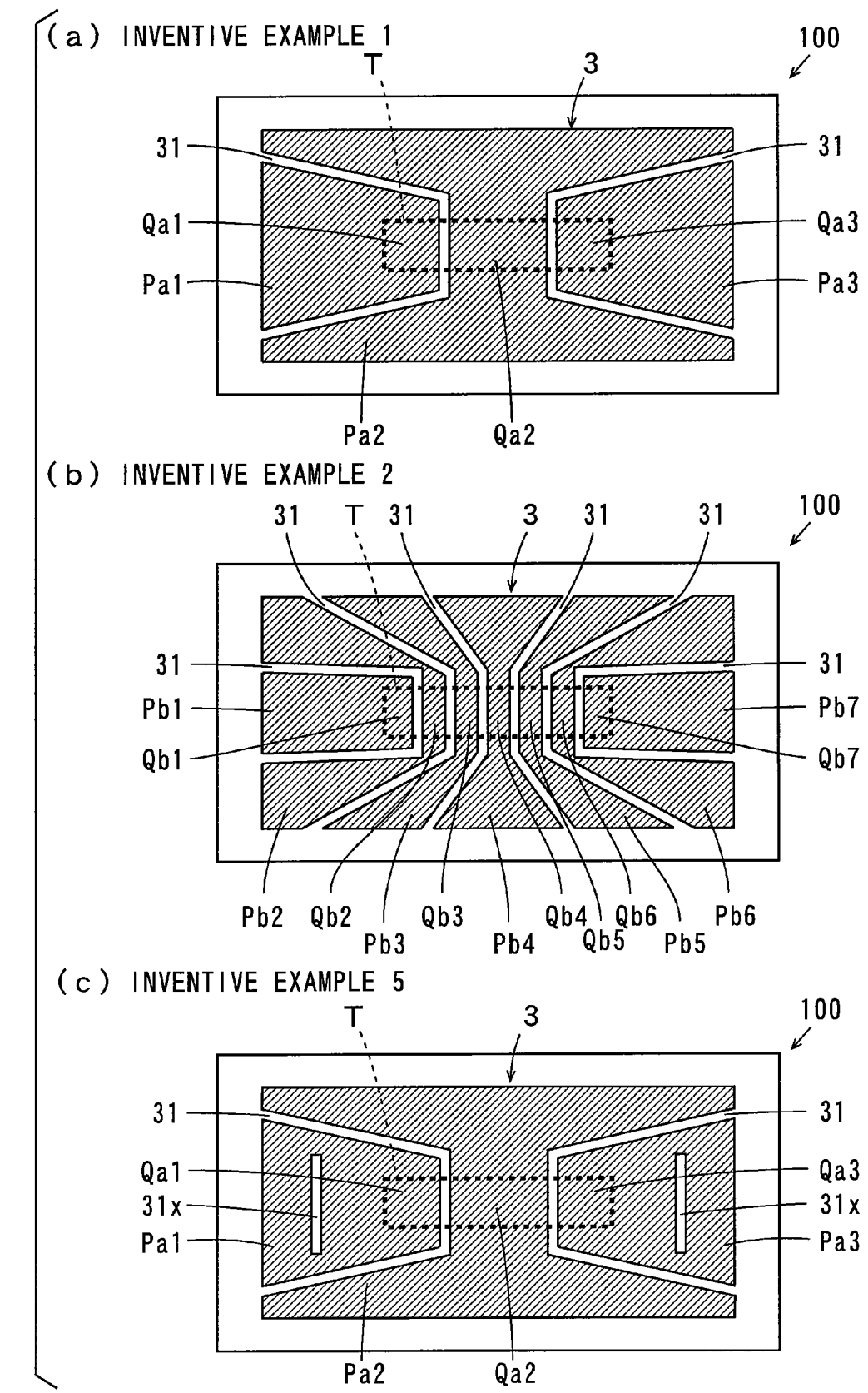
FIG. 9 shows plan views of COF substrates of inventive examples 1, 2 and 5.

FIG. 9 (a) is a plan view of a COF substrate 100 manufactured in an inventive example 1. In the inventive example 1, the two slits 31 were formed to divide the metal layer 3 into large regions Pa1, Pa2, Pa3. The large regions Pa1, Pa2, Pa3 include small regions Qa1, Qa2, Qa3 of the opposite region T, respectively.

The area ratio among the large regions Pa1, Pa2, Pa3 was set to 1:2:1, and the area ratio among the small regions Qa1, Qa2, Qa3 was set to 1:2:1. The width of the slit 31 was set to 200 μm.

Note that polyimide was used as the material for the insulating layer 1, and copper was used as the material for the conductive traces 2 and the metal layer 3. The thickness of the insulating layer 1 was 35 μm, and the thickness of the metal layer 3 was 15 μm. The width of the terminal 21 of the conductor trace 2 was 8 μm, and an interval between adjacent terminals 21 was 12 μm.

The length of the shorter side of the metal layer 3 was 15 mm, and the length of the longer side thereof was 40 mm. The electronic component 5 having the shorter side of 1.5 mm and the longer side of 20 mm in planar view was used.

(6-2) Inventive Example 2

The COF substrate 100 of an inventive example 2 is different from the COF substrate 100 (FIG. 9 (a)) of the inventive example 1 in the following points.

FIG. 9 (b) is a plan view of the COF substrate 100 manufactured in the inventive example 2. In the inventive example 2, six slits 31 were formed to divide the metal layer 3 into large regions Pb1, Pb2, Pb3, Pb4, Pb5, Pb6 and Pb7. The large regions Pb1, Pb2, Pb3, Pb4, Pb5, Pb6 and Pb7 include small regions Qb1, Qb2, Qb3, Qb4, Qb5, Qb6 and Qb7 of the opposite region T, respectively.

The area ratio among the large regions Pb1, Pb2, Pb3, Pb4, Pb5, Pb6 and Pb7 was set to 1:1:1:1:1:1:1, and the area ratio among the small regions Qb1, Qb2, Qb3, Qb4, Qb5, Qb6 and Qb7 was set to 1:1:1:1:1:1:1.

(6-3) Inventive Example 3

The COF substrate 100 of an inventive example 3 is different from the COF substrate 100 (FIG. 9(a)) of the inventive example 1 in the following points.

In the inventive example 3, the COF substrate 100 having the configuration shown in FIG. 7 (c) was manufactured. Note that the area ratio among the large regions 3a, 3b, 3c was set to 1:1:1, and the area ratio among the small regions Ta, Tb, Tc was set to 1:1:1.

(6-4) Inventive Example 4

The COF substrate 100 of an inventive example 4 is different from the COF substrate 100 (FIG. 9(a)) of the inventive example 1 in the following points.

In the inventive example 4, the COF substrate 100 having the configuration shown in FIG. 8 (b) was manufactured. Note that the area ratio among the medium regions 3j, 3k, 3l was set to 1:1:1, and the area ratio among the small regions Tj, Tk, Tl was set to 1:1:1.

(6-5) Inventive Example 5

The COF substrate 100 of an inventive example 5 is different from the COF substrate 100 (FIG. 9(a)) of the inventive example 1 in the following points.

FIG. 9 (c) is a plan view of the COF substrate 100 manufactured in the inventive example 5. In the inventive example 5, the slits 31x were formed in respective portions of the large regions Pa1 and Pa3, which were on the outer side of the opposite region T, of the metal layer 3 so as not to divide the large regions Pa1 and Pa3. Note that the area ratio among the large regions Pa1, Pa2, Pa3 was set to 1:2:1, and the area ratio among the small regions Qa1, Qa2, Qa3 was set to 1:2:1.

(6-6) Inventive Example 6

The COF substrate 100 of an inventive example 6 is different from the COF substrate 100 (FIG. 9(a)) of the inventive example 1 in the following points.

Figure 10:
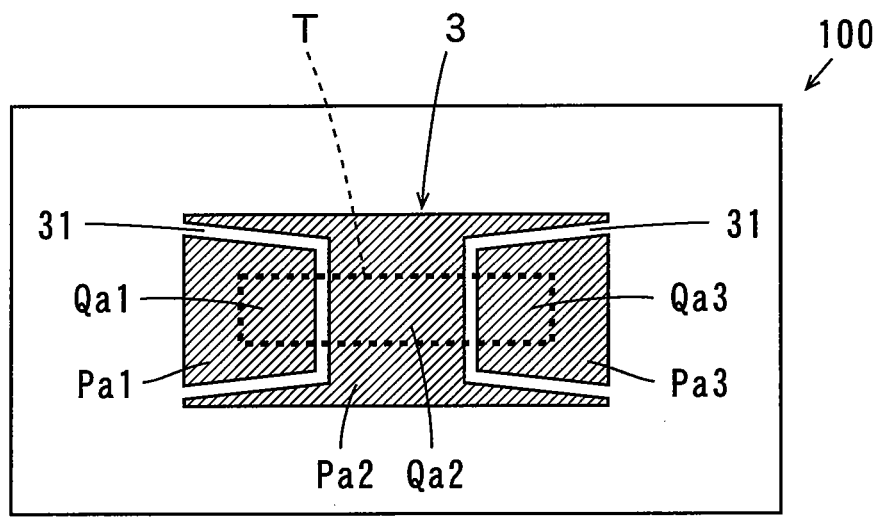
FIG. 10 shows plan views of COF substrates of inventive examples 6 and 7.
Figure 10:
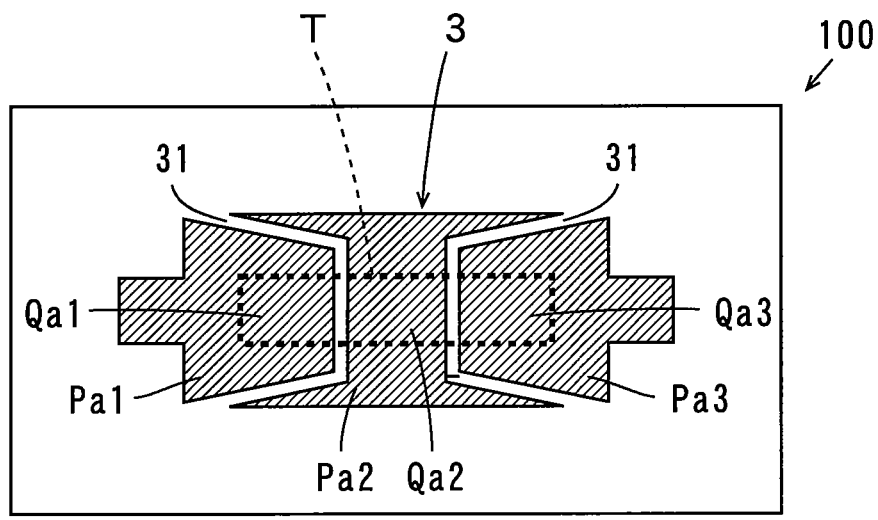

FIG. 10 (a) is a plan view of the COF substrate 100 manufactured in the inventive example 6. In the inventive example 6, the area of the metal layer 3 was set to 2.5 times as large as the area of the opposite region T. The area ratio among the large regions Pa1, Pa2, Pa3 was set to 2:3:2, and the area ratio among the small regions Qa1, Qa2, Qa3 was set to 1:2:1.

(6-7) Inventive Example 7

The COF substrate 100 of an inventive example 7 is different from the COF substrate 100 (FIG. 9(a)) of the inventive example 1 in the following points.

FIG. 10 (b) is a plan view of the COF substrate 100 manufactured in the inventive example 7. In the inventive example 7, projections outwardly extending from the pair of shorter sides of the metal layer 3 were provided in the metal layer 3, and the area of the metal layer 3 was set to five times as large as the opposite region T. The area ratio among the large regions Pa1, Pa2, Pa3 was set to 1:1:1, and the area ratio among the small regions Qa1, Qa2, Qa3 was set to 1:1:1.

(6-8) Comparative Example 1

Figure 11:
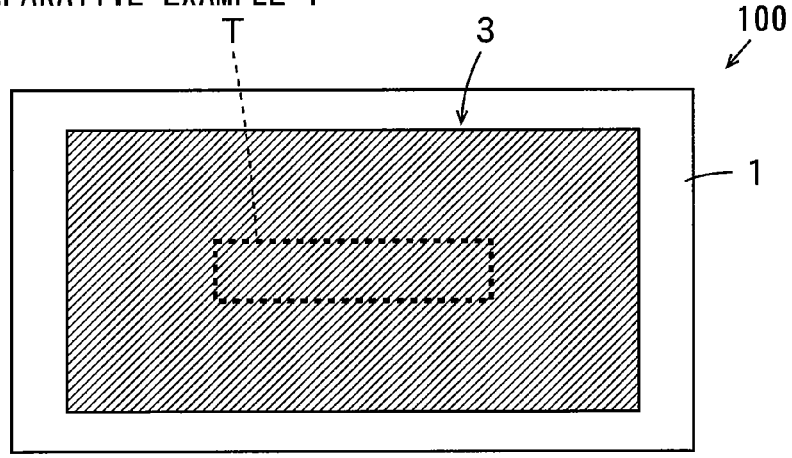
FIG. 11 shows plan views of COF substrates of comparative examples 1 to 3.
Figure 11:
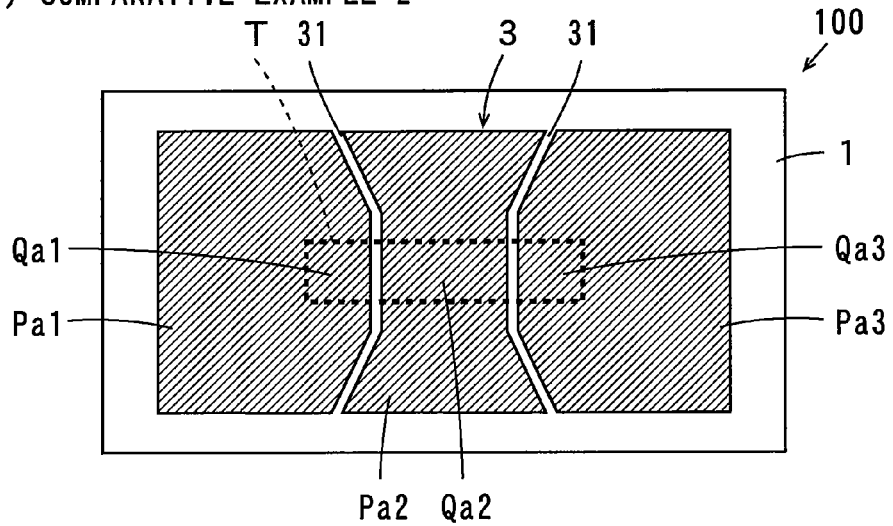
Figure 11:
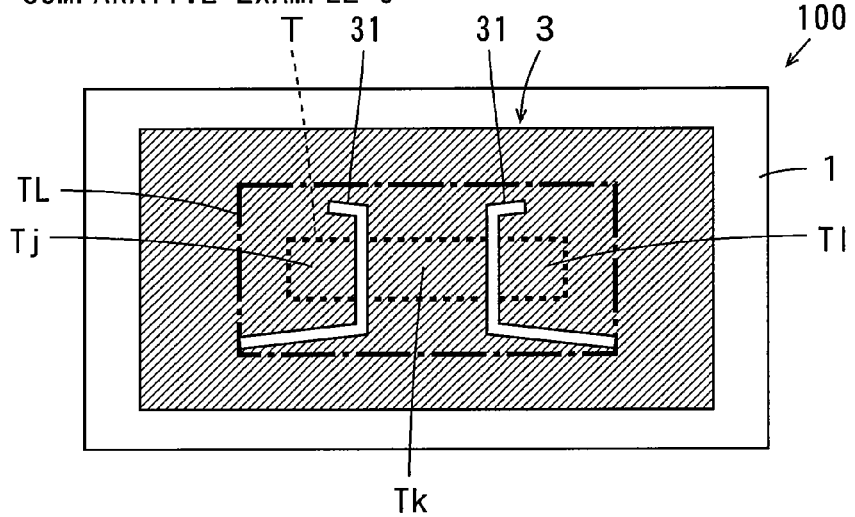
Figure 12:
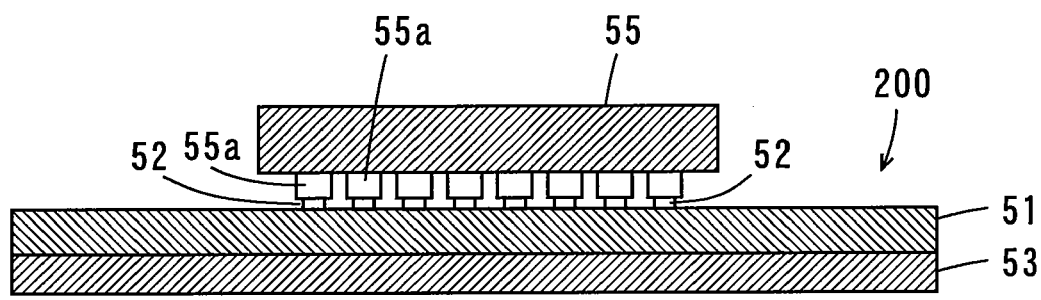
FIG. 12 is a schematic sectional view of a conventional COF substrate provided with a metal layer.

FIG. 11 (a) is a plan view of the COF substrate 100 manufactured in a comparative example 1. In the comparative example 1, the COF substrate 100 (FIG. 9(a)) which was the same as that of the inventive example 1 except that the slits 31 were not formed in the metal layer 3 was manufactured.

(6-9) Comparative Example 2

The COF substrate 100 of a comparative example 2 is different from the COF substrate 100 (FIG. 9(a)) of the inventive example 1 in the following points.

FIG. 11 (b) is a plan view of the COF substrate 100 manufactured in the comparative example 2. In the comparative example 2, the area ratio among the large regions Pa1, Pa2, Pa3 was set to 2:1:2, and the area ratio among the small regions Qa1, Qa2, Qa3 was set to 1:2:1. In this case, the ratios of the areas of the large regions Pa1, Pa2, Pa3 with respect to the whole area of the metal layer 3 were not within the error range of ±30 [%] of the ratios of the areas of the small regions Qa1, Qa2, Qa3 with respect to the whole area of the opposite region T.

(6-10) Comparative Example 3

FIG. 11 (c) is a plan view of the COF substrate 100 manufactured in a comparative example 3. In the comparative example 3, the COF substrate 100 which was the same as that of the inventive example 4 except that one end of each slit 31 was positioned on the inner side of the one-dot and dash line TL was manufactured.

(6-11) Evaluation

The electronic component 5 was mounted on each of the COF substrates 100 of the inventive examples 1 to 7 and the comparative examples 1 to 3 by thermocompression bonding. Note that at the time of mounting, a tool temperature was 450° C., a stage temperature was 100° C., and a mounting load was 30 N. Here, the tool temperature is a heating temperature of the terminals 21 of the conductor traces 2 or the bumps 5a of the electronic component 5, and the stage temperature is a temperature of a stage on which each of the COF substrates 100 is placed at the time of mounting of the electronic component 5.

The mounted electronic components 5 were driven, and the heat dissipation was examined. In addition, a thermal cycle test of each of the COF substrates 100 having the electronic components 5 mounted thereon was carried out. 500 cycles of heating each of the COF substrates 100 to 125° C. and then cooling it to −40° C. were carried out, and the connectivity between the terminals 21 of the conductor traces 2 and the bumps 5a of the electronic component 5 was examined. The results are shown in Table 1.

TABLE 1

| | HEAT DISSIPATION [%] | CONNECTIVITY [%] (200 CYCLES) | CONNECTIVITY [%] (500 CYCLES) |
|---|---|---|---|
| INVENTIVE EXAMPLE 1 | 100 | 100 | 100 |
| INVENTIVE EXAMPLE 2 | 100 | 100 | 100 |
| INVENTIVE EXAMPLE 3 | 100 | 100 | 100 |
| INVENTIVE EXAMPLE 4 | 100 | 100 | 100 |
| INVENTIVE EXAMPLE 5 | 100 | 100 | 100 |
| INVENTIVE EXAMPLE 6 | 60 | 100 | 100 |
| INVENTIVE EXAMPLE 7 | 100 | 100 | 100 |
| COMPARATIVE EXAMPLE 1 | 100 | 60 | 20 |
| COMPARATIVE EXAMPLE 2 | 40 | 100 | 100 |
| COMPARATIVE EXAMPLE 3 | 100 | 60 | 30 |

In Table 1, heat dissipation indicates a ratio of no occurrence of failures due to heat generated at the time of driving the electronic component 5. Connectivity indicates a ratio of connectivity between the terminals 21 of the conductor traces 2 and the bumps 5a of the electronic component 5 being well maintained at a time point where the thermal cycle test was carried out for 200 cycles or 500 cycles.

As shown in Table 1, the heat dissipation was 100 [%] in the COF substrates 100 of the inventive examples 1 to 5 and 7. Also in the COF substrate 100 of the inventive example 6, the heat dissipation was as high as 60 [%]. In addition, the connectivity at the time point where the thermal cycle test was carried out by 200 cycles and the connectivity at the time point where the thermal cycle test was carried out by 500 cycles were both 100 [%] in the COF substrates 100 of the inventive examples 1 to 7.

Meanwhile, the connectivity at the time point where the thermal cycle test was carried out by 200 cycles and the connectivity at the time point where the thermal cycle test was carried out by 500 cycles were as low as 60 [%] and 20 [%], respectively, in the COF substrate 100 of the comparative example 1. In the COF substrate 100 of the comparative example 2, the heat dissipation was as low as 40 [%]. In the COF substrate 100 of the comparative example 3, the connectivity at the time point where the thermal cycle test was carried out by 200 cycles and the connectivity at the time point where the thermal cycle test was carried out by 500 cycles were as low as 60 [%] and 30 [%], respectively.

These results show that the slits 31 were formed to divide the metal layer 3 into the plurality of large regions (medium regions), and the area ratio among the plurality of large regions (medium regions) and the area ratio among the small regions included therein were set substantially equal, so that the connectivity between the terminals 21 of the conductor traces 2 and the bumps 5a of the electronic component 5 can be improved while sufficient heat dissipation is ensured.

(7) Correspondences Between Elements In The Claims And Parts In Embodiments

In the following paragraph, non-limiting examples of correspondences between various elements recited in the claims below and those described above with respect to various preferred embodiments of the present invention are explained.

In the above-described embodiments, the COF substrate 100 is an example of a printed circuit board, the insulating layer 1 is an example of a base insulating layer, the opposite region T is an example of a opposite region, the region of the metal layer 3 on the inner side of the one-dot and dash line TL is an example of a stress relief region, the large regions 3a, 3b, 3c, 3d, 3e, 3f, 3g, 3h, 3i, Pa1, Pa2, Pa3, Pb1, Pb2, Pb3, Pb4, Pb5, Pb6, Pb7, and the medium regions 3j, 3k, 3l are examples of a large region, the small regions Ta, Tb, Tc, Td, Te, Tf, Tg, Th, Ti, Tj, Tk, Tl, Qa1, Qa2, Qa3, Qb1, Qb2, Qb3, Qb4, Qb5, Qb6, Qb7 are examples of a small region, and the slits 31, 31a are examples of an opening.

As each of various elements recited in the claims, various other elements having configurations or functions described in the claims can be also used.

(8) Other Embodiments

The material for the insulating layer 1 and the cover insulating layer 4 is not limited to polyimide. For example, another insulating material such as polyethylene terephthalate, polyethernitrile, polyethersulfone may be used. Moreover, the material for the conductor traces 2 is not limited to copper. For example, another metal material such as a copper alloy, gold, aluminum may be used.

The material for the metal layer 3 is not limited to copper. For example, metal having high thermal conductivity such as copper, gold, silver or aluminum is preferably used.

The present invention is applicable to various printed circuit boards such as a flexible printed circuit board and a rigid printed circuit board. Moreover, the electronic component 5 is not limited to an LSI. For example, another electronic component such as a capacitor may be used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A printed circuit board on which an electronic component is to be mounted, comprising:
   a base insulating layer;
   a conductor trace that is formed on one surface of said base insulating layer and has a terminal to be electrically connected to said electronic component;
   a cover insulating layer that has an opening causing said terminal of said conductor trace to be exposed and is formed on the one surface of said base insulating layer to cover said conductor trace excluding a portion below said opening; and
   a metal layer formed on the other surface of said base insulating layer, wherein
   said metal layer includes
   an opposite region that coincides with said opening of said cover insulating layer, and
   a stress relief region that contains said opposite region and is larger than said opposite region,
   one or plurality of slits are formed in said metal layer to divide said opposite region into a plurality of small regions and divide said stress relief region into a plurality of large regions including said small regions, respectively, and
   when a ratio of an area of one of said small regions with respect to a whole area of said opposite region is A %, a ratio of an area of said large region including said one small region with respect to a whole area of said stress relief region is set to not less than (A−α) % and not more than (A+α) %, said α being not more than (A×0.3).

2. The printed circuit board according to claim 1, wherein a periphery of said stress relief region is on an outer side of a periphery of said opposite region by not less than 2 mm.

3. The printed circuit board according to claim 1, wherein an area of said stress relief region is equal to the area of said metal layer.

4. The printed circuit board according to claim 1, wherein the area of said metal layer is at least three times as large as the area of said opposite region.

5. The printed circuit board according to claim 1, wherein said opposite region has a rectangular shape, and
   said one or plurality of slits are formed to cross said opposite region along any of sides of said opposite region.

6. A method of manufacturing a printed circuit board on which an electronic component is to be mounted, comprising the steps of:
   forming a conductor trace having a terminal to be electrically connected to said electronic component on one surface of a base insulating layer;
   forming on the one surface of said base insulating layer a cover insulating layer that has an opening causing said terminal of said conductor trace to be exposed and covers said conductor trace excluding a portion below said opening;

forming on the other surface of said base insulating layer a metal layer including an opposite region that coincides with said opening of said cover insulating layer, and a stress relief region that contains said opposite region and is larger than said opposite region; and forming one or plurality of slits in said metal layer to divide said opposite region into a plurality of small regions and divide said stress relief region into a plurality of large regions including said small regions, respectively, and when a ratio of an area of one of said small regions with respect to a whole area of said opposite region is A %, a ratio of an area of said large region including said one small region with respect to a whole area of said stress relief region is set to not less than $(A-\alpha)$ % and not more than $(A+\alpha)$ %, said $\alpha$ being not more than $(A \times 0.3)$.

\* \* \* \* \*